United States Patent [19]
Padgett et al.

[11] 3,943,496
[45] Mar. 9, 1976

[54] MEMORY CLOCKING SYSTEM

[75] Inventors: Clarence W. Padgett, Costa Mesa; Francis L. Newman, El Toro, both of Calif.

[73] Assignee: Rockwell International Corporation, El Segundo, Calif.

[22] Filed: Sept. 9, 1974

[21] Appl. No.: 504,399

[52] U.S. Cl. .......................... 340/173 DR; 307/238
[51] Int. Cl.² .......................................... G11C 11/40
[58] Field of Search ............................. 340/173 DR

[56] References Cited
UNITED STATES PATENTS

| | | | |
|---|---|---|---|
| 3,535,699 | 10/1970 | Gaensslen | 340/173 DR |
| 3,719,932 | 3/1973 | Cappon | 340/173 DR |
| 3,748,651 | 7/1973 | Mesnik | 340/173 DR |
| 3,760,379 | 9/1973 | Nibby | 340/173 DR |
| 3,858,185 | 12/1974 | Reed | 340/173 DR |

*Primary Examiner*—Terrell W. Fears
*Attorney, Agent, or Firm*—H. Fredrick Hamann; G. Donald Weber, Jr.; Robert Ochis

[57] ABSTRACT

A solid state memory employs a plurality of memory cells each capable of storing either of two different binary values. The memory cells require periodic application of a refresh pulse to the memory cell to, without rewriting, enhance at least one of the two different binary values which the memory cells can store, in order to prevent loss of that binary value over a period of time. The reliability of the memory is improved by supplying a refresh signal which includes a plurality of refresh pulses in each memory cycle.

14 Claims, 3 Drawing Figures

MEMORY CLOCKING SYSTEM

BACKGROUND OF THE INVENTION

1. Field of the Invention

The invention relates generally to memory systems and more particularly to solid state memories which require periodic refreshing of the information stored therein.

2. Description of the Prior Art

One of the major problems in a semiconductor industry is increasing the yield of semiconductor device fabrication processes. Unlike many industries where substantially 100 percent yield can be guaranteed, the semiconductor industry constantly faces yield problems. In many processes 25 percent yield is considered excellent yield. Conseuquently, any improvement in process yields has a startling effect on production capacity of a semiconductor plant without requiring any further capital investment.

Semiconductor manufacturing yields are generally poor on a percentage basis because of the samll size and fine detail of the devices being produced. Slight variations in process conditions, some of them virtually undetectable, frequently produce measurable changes in the device characteristics and in many cases render the final device inoperative. While yield can be accounted for in the final cost of individual devices, poor device yield within a large scale integrated (LSI) circuit is compounded because a single faulty device renders the entire circuit useless even though it contains many good devices. Consequently, the semiconductor industry continually strives to increase the yield of individual devices within an integrated circuit. Alternatively, the yield of the integrated circuits may be increased by changes in circuit operation.

Each device must be kept as small as possible in large scale integrated circuits in order to accommodate a large number of devices in the area of a die. This is particularly true where a single device, for example memory cells in LSI circuits, are duplicated many times on the die. It is common, for decoding simplicity, to make the number of memory storage cells on a die a power of two. Memories are now being produced with 1,024 memory cells per die, with chips measuring 140 mils by 140 mils. In order to achieve such memory cell densities, it has been necessary to shrink the cell as much as possible. With this objective, memories which require periodic refreshing of the information stored therein have been developed because they result in memory cells which utilize less semiconductor area than memory cells which do not require refreshing. Such memory cells which are self-refreshing from clock signals are considered preferable to those cells which must be periodically re-written because the self-refreshing cells provide a more versatile memory.

SUMMARY OF THE INVENTION

This invention is a clocking system for a solid state memory which provides a novel refresh clock signal. In the inventive refresh clock signal, a refresh pulse is inserted between the write portion of a bit time and the read portion of the following bit time. Two referesh pulses are applied to the memory cell each bit time, one, as in the prior art, is applied during the read portion of the clock cycle and an additional one is applied during a subsequent portion of the bit time between the end of the write portion of that bit time and the beginning of the read portion of the following bit time. In this way, the information written into a memory cell is refreshed at least once before the information can be read from the memory cell. This is accomplished without interference with pre-existing memory access times, cycle times and the like. This change in the refresh clock signal can substantially improve the operating characteristics of prior art memory cells.

A refresh clock signal generator may derive the refresh clock signals of the invention from generally available clock signals.

DETAILED DESCRIPTION OF THE PREFERRED EMBODIMENT

Figure 1:
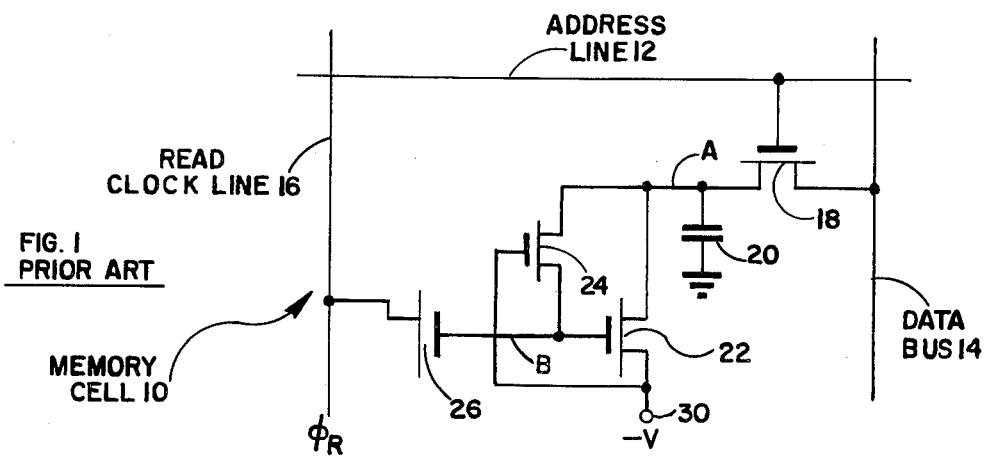
FIG. 1 is a self-refreshing RAM storage cell of a type to which the present invention is applicable.

A prior art, four phase, solid state memory cell to which the instant invention is applicable is illustrated generally at 10 in the circuit diagram of FIG. 1. This memory cell and its operation are described in detail in order that the improvement achieved by the instant invention may be fully appreciated. It will be understood, however, that the present invention is applicable to other memory cells as well. Prior art memory cell 10 is comprised of an address field effect transistor (FET) 18, a read and boost FET 22, an isolation FET 24, a temporary-storage capacitor 20 and a read and boost field effect capacitor 26. In the illustrated embodiment all of the field effect devices are p-channel devices. Memory cell 10 is connected to the memory control system by an address line 12, a data bus 14, and a read clock line 16. A voltage source 30 supplies −V volts to memory cell 10. In a preferred embodiment of the present invention source 30 provides −17 volts.

Address transistor 18 has the gate electrode thereof connected to address line 12, the source electrode thereof connected to the data bus 14 and the drain electrode thereof connected to node A in the memory cell. Memory cell 10 is addressed by applying a suitable negative voltage such as −17 volts to address line 12 to render transistor 18 conductive.

Temporary storage capacitor 20 has one plate thereof connected to node A and the other plate thereof connected to a suitable reference voltage source such as ground. Capacitor 20 temporarily stores information being written into the memory cell from data bus 14 via address transistor 18.

Read and boost transistor 22 has the drain electrode thereof connected to node A, the source electrode thereof connected to the relatively negative voltage source 30 and the gate electrode thereof connected to node B in the memory cell.

Isolation transistor 24 has the drain electrode thereof connected to node B, the source electrode thereof connected to node A and the gate electrode thereof connected to the relatively negative voltage source 30. When isolation transistor 24 is on (conductive) it provides a conductive path between nodes A and B. When isolation transistor 24 is off, nodes A and B are isolated from each other.

Read and boost capacitor 26 comprises a field effect semiconductor metal oxide capacitor (SMOC) and has a gate electrode which comprises a first or gate plate of SMOC 26 which is connected to node B and a source electrode which is connected to read clock line 16. The source electrode comprises the contact to a second or "source" plate of SMOC 26. This second plate of SMOC 26 comprises the source of an FET structure and incorporates the channel portion of the FET structure when the gate to source voltage is such that the "FET" would be on. No drain region or drain contact is incorporated in SMOC 26 because the SMOC serves as a capacitor, not a switch. The capacitance of SMOC capacitor 26 is small unless the gate electrode thereof is more than one threshold voltage of SMOC 26 [$V_{T(26)}$] more negative than the source electrode, in which case the capacitance of SMOC 26 increases substantially due to the incorporation of the channel region into the source plate as a result of inversion in the channel.

Figure 2:
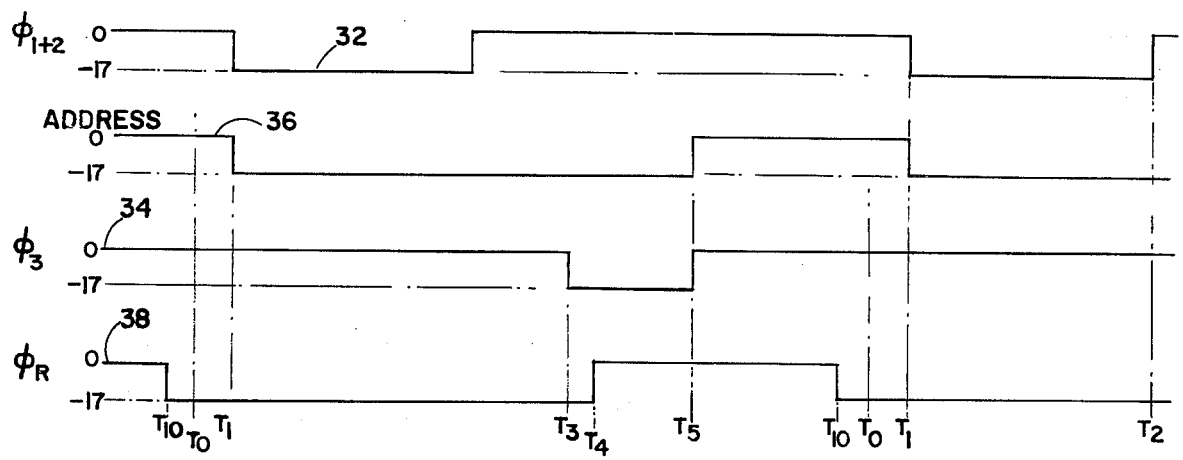
FIG. 2 is a diagram of prior art clock signals for the memory cell of FIG. 1.

Briefly, with reference to FIGS. 1 and 2, memory cell 10 operates in the following fashion. At the beginning of each clock cycle, at time $T_o$, the prior art read clock signal 38 ($\phi_R$) is at −17 volts and data bus 14 and address line 12 are at ground voltage. At time $T_o$, data bus 14 has been prechanged to ground voltage, but is isolated from all voltage sources.

In order to avoid unnecessarily complicating the following description, it will be assumed that the memory cell is not addressed during this clock cycle.

At time $T_o$, the voltage on read clock line 16 will be −17 volts as a result of the read clock signal $\phi_R$ having dropped to −17 volts at time $T_{10}$ of the previous clock cycle. The other circuit conditions in memory cell 10 will depend on whether a logical one or a logical zero is stored in the memory cell. Since the memory cell is not being addressed at time $T_o$, address transistor 18 will be off no matter what value is stored in memory cell 10. If a logical zero is stored in the memory cell, then read and boost transistor 22 will be off or non-conductive and isolation transistor 24 will be on or conductive. Since isolation transistor 24 is on, the voltage at node B will be the same as the voltage at node A which will be a small negative voltage on the order of −1 volt or smaller. In contrast, if memory cell 10 stores a logical one, then read and boost transistor 22 will be on and isolation transistor 24 will be off. The voltage at node B will be on the order of −25 volts and the voltage at node A will be on the order of −17 volts. In an actual physical embodiment of memory 10, there will be some leakage of charge from node B while node B is at a voltage in the neighborhood of −25 volts. The quantity of this leakage will depend on the individual characteristics of the memory cell and may vary from memory cell to memory cell.

In consequence of the fact that the memory cell is not being addressed during this clock cycle, the first change in the voltage conditions specified above as existing at time $T_o$ occurs at time $T_4$ when the $\phi_R$ clock signal 38 switches from −17 volts to ground voltage.

At time $T_4$, after the read clock signal 38 has reached ground voltage the circuit conditions within memory cell 10 will once again depend on whether a logical one or a logical zero is stored therein. Independent of the information stored in the memory cell, both the address transistor 18 and read and boost transistor 22 will be off. If memory cell 10 stores a logical zero, then isolation transistor 24 will be on and the voltage at node B will be the same as the voltage at node A and will be substantially ground voltage. The change in the voltage at nodes A and B from a small negative while read clock signal 38 was at −17 volts to substantially ground voltage now that read clock signal 38 is at ground voltage is a result of the small value of the capacitance of SMOC 26 which results from the fact that the source plate of SMOC 26 is at a substantially more negative voltage than the gate plate of SMOC 26.

If a logical one is stored in memory cell 10, then leakage from node B during the time ($T_{10} - T_4$) that the read clock signal 38 was at −17 volts, would cause the voltage at node B to be less negative than −13 volts after time $T_4$ if isolation transistor 24 remained non-conductive. The voltage at node B under those conditions depends on the rate of leakage from node B during the preceding read period. However, in the embodiment illustrated isolation transistor 24 becomes conductive if the voltage at node B becomes less negative than −13 volts (assuming that the threshold voltage of isolation transistor 24 [$V_{T(24)}$] is 4 volts). As a consequence, charge from node A flows to node B with a resultant decrease in the voltage at node A.

In a properly operating memory cell, the final voltage at node B is substantially −13 volts and the voltage at node A is in the range between −17 and −13 volts. The actual voltage at node A depends on the rate of leakage of charge within the memory cell and the size of capacitor 20. In a total absence of leakage, the voltage at node A would remain at −17 volts. However, in the presence of leakage, the voltage at node A becomes less negative as the quantity of leakage increases. The charge which flows from node A to node B to restore the voltage at node B to −13 volts replaces any charge which leaked from node B and has the effect of refreshing a logical one stored in the memory cell. Since the logical one is refreshed in each clock cycle, the memory system is capable of storing a logical one indefinitely without the necessity of rewriting the logical one. Such refreshing action can only take place if the voltage at node B is sufficiently negative for read and boost transistor 22 to be rendered conductive during at least part of the time period $T_{10}-T_4$.

If the voltage on node B is not sufficient to render read and boost transistor 22 conductive during at least part of the time period $T_{10}-T_4$, then no boost or refresh effect takes place and the memory will treat the information stored in the memory cell as a logical zero. Further, the charge on nodes A and B will eventually leak off to leave substantially ground voltage at those nodes. The exact voltage level which is the borderline between those voltages which induce conductivity in transistor 22 and those voltages which do not induce conductivity in transistor 22 depends on the individual component values within the memory cell, however, voltages as positive as about −9 volts should render read and boost transistor 22 sufficiently conductive to induce a refreshing action. Such small negative voltages can be referred to as weak logical ones because they are logical ones but do not have the characteristics (namely a voltage of −13 volts on node B) associated with a solid reliably stored logical one. Such weak logical ones will be boosted or refreshed over a period of a few memory cycles to become strong logical ones unless the memory cell is excessively leaky.

During each clock cycle, data bus 14 is precharged to ground voltage during a time period $T_5-T_9$ by means of the $\phi_4$ clock signal. This precharge is performed because as will be seen hereinafter the memory cell is capable of driving the data bus negative from ground voltage when a logical one (negative voltage) is stored in the memory cell, but is incapable of driving a negative data bus to ground level when a logical zero (ground voltage) is stored in the memory cell. This precharging, however, does not affect any voltages within memory cell 10.

Since memory cell 10 is not being addressed in the present memory cycle, the next change in the voltage of clock signals applied to the memory cell occurs at time $T_{10}$, when the $\phi_R$ clock signal 38 returns to $-17$ volts. If a logical zero is stored in the memory cell, the small capacitance of SMOC 26 will draw a small amount of charge from node A when the source plate is SMOC 26 is pulled down to $-17$ volts. This charges the small capacitance of SMOC 26 with the result that the voltages at nodes A and B decrease slightly to a slightly negative voltage such as about $-1$ volt.

Where a logical one is stored in the memory cell, SMOC 26 is "ON" and there is an inversion layer within the channel region of the field effect structure at all times. This results in a large capacitance for the SMOC. As a consequence, when the read clock signal 38 drops to $-17$ volts at time $T_{10}$, a substantial charge could have to be drawn from node A to charge SMOC 26 to an additional 17 volts needed to retain node B in the vicinity of the previously existing $-13$ volts. No such large quantities of charge are available because of the relatively small capacitance of node A and consequently if node A is at a more positive voltage than $-13$ volts sufficient charge will flow through isolation transistor 24 to lower the voltage at node A to $-13$ volts so that transistor 24 turns off. Isolation transistor 24 is further turned solidly off by the drop in the voltage of node B which is induced by the capacitive coupling of SMOC 26 to the read clock line 16. Under these conditions, the voltage at node B will drop to something on the order of $-25$ volts. Once the voltage at node B drops more than a threshold voltage of read transistor 22 $[V_{T(22)}]$(4 volts) more negative than the voltage at node A, read and boost transistor 22 becomes conductive and node A is charged more negative. If the voltage at node B becomes more negative than negative supply 30 by more than threshold voltage of read and boost transistor 22, then node A can charge to $-17$ volts. This charging action provides the charge to the memory cell which is necessary to replace the charge which leaks away from the memory cell through the semiconductor substrate.

There is no change in the circuit conditions within the memory cell during the time period from $T_{10}$ of one clock cycle to $T_1$ of the next clock cycle. Consequently, the above outlined sequence of events will repeat indefinitely until memory cell 10 is addressed.

If the memory cell 10 is to be addressed during a clock cycle, then the address signal 36 is applied to address line 12. At time $T_1$, the address signal 36 drops from ground voltage to $-17$ volts. This applies $-17$ volts to the gate electrode of address transistor 18 thereby rendering it conductive. The events which take place when address transistor 18 becomes conductive depends on whether a logical zero or a logical one is stored within memory cell 10.

If a logical zero is stored within memory cell 10, then just prior to address transistor 18 becoming conductive, the circuit conditions within memory cell 10 are such that read transistor 22 is off, isolation transistor 24 is on and the voltage at nodes A and B is a small negative voltage such as $-1$ volt. When transistor 18 becomes conductive, there is charge sharing between node A and data bus 14 which is floating at ground voltage. As a consequence of the fact that data bus 14 has a substantially larger capacitance than nodes A and B (typically 10 to one), the voltage on data bus 14 and at nodes A and B will stabilize at substantially ground voltage. The retention of ground voltage on data bus 14 is interpreted by sensing circuitry (not shown) connected to data bus 41 as an indication that a logical zero was stored in memory cell 10.

If a logical one is stored in memory cell 10, then during the time interval from $T_{10}$ of one clock cycle to $T_1$ of the next clock cycle read and boost transistor 22 is on, isolation transistor 24 is off, the voltage at node B is substantially $-25$ volts and the voltage at node A is substantially $-17$ volts or approaching $-17$ volts because of conduction through read transistor 22. Read and boost transistor 22 is turned on hard by the approximately 8 volt gate to source voltage ($V_{go}$) applied thereto. While transistor 22 is turned on hard, it has a relatively low impedance. As will become apparent presently, it is important that read transistor 22 have a low impedance for proper operation of the memory cell during read period when a logical one is stored.

When address transistor 18 becomes conductive at time $T_1$, charge flows from node A through address transistor 22 to data bus 14 to charge the data bus negative. As charge flows from node A through transistor 18, compensating charge must flow through read transistor 22 to node A in order to maintain node A sufficiently negative that isolation transistor 24 does not become conductive. A p-channel field effect transistor will become conductive whenever the voltage at either the source of drain thereof is more positive than the voltage at the gate electrode thereof by amount greater than the threshold voltage ($V_T$) of the transistor. In the present embodiment, the threshold voltage of isolation transistor 24 $[V_{T(24)}]$ is 4 volts. Consequently, the requirement of nonconduction in isolation transistor 24 is met so long as the voltage at node A remains more negative than $-13$ volts. Thus, the impedance of read transistor 22 must be low enough that the current drawn from data bus 14 causes a voltage drop of less than 4 volts across transistor 22. The actual voltage to which data bus 14 will charge depends on the duration of the read cycle, the impedance of address transistor 18, the impedance of read transistor 22, and the capacitance of data bus 14 which is typically 10 times the capacitance of nodes A and B. However, the voltage to which data bus 14 charges is not critical for readout purposes because the sensing circuitry connected to data bus 14 can be set to detect a wide range of negative voltages as logical ones without generating erroneous results. The sensing circuitry (not shown) connected to data bus 14 interprets a negative voltage within its preset sensing range as an indication that a logical one is stored in memory cell 10. This indication is then supplied to external circuitry (not shown).

Where the same information is to be retained in memory cell 10, the next change in the circuit conditions in memory cell 10 occurs at time $T_4$ when read clock signal 38 goes to ground voltage. If a logical zero is stored in memory cell 10, then the conditions within memory cell 10 will be substantially unchanged by read clock signal 38 going to ground voltage. However, if a logical one is stored in memory cell 10, then when the read clock signal goes to ground voltage at time $T_4$, the voltage at node B will rise to approximately −13 volts. This turns read transistor 22 off. Since address transistor 18 is still conductive, data bus 14 must have already been charged to a voltage value which when present on nodes A and B is sufficient to render read transistor 22 conductive during the otherwise the logical one stored in the memory cell would be lost because it could not be refreshed and would be read as a logical zero. Thus, some of the charge on node B may be dissipated, but not much can be allowed to be dissipated in this manner.

The remaining portion of the clock cycle will be similar to that described previously in connection with the operation of memory cell 10 when it was not addressed.

If new information is to be written into the memory cell, then the memory cell is addressed in substantially the same way as described hereinabove. When addressed, the memory cell 10 will charge data bus 14 to a voltage corresponding to the information already stored within the memory cell. Thus, if a logical zero is stored in memory cell 10, data bus 14 will remain at substantially ground voltage. If a logical "one" is stored in memory cell 10, then data bus 14 will be charged to a voltage in the vicinity of −13 volts. Subsequently, during the write period ($T_3$–$T_5$) data bus 14 is driven by a source of the information which is to be written into memory cell 10. At time $T_3$ when a $\phi_3$ clock signal 34 goes from ground voltage to −17 volts, data bus 14 will be driven in accordance with the information to be written into the memory cell. If a logical zero is to be written into the memory cell, then data bus 14 will be grounded. If the memory cell is already storing a logical zero, this will produce no change in the conditions within memory cell 10. However, if the memory cell was previously storing a logical one, then data bus 14 would have already been charged to about −13 volts during the read period ($T_1$–$T_3$). The application of ground voltage to the data bus drives the data bus to ground voltage thereby increasing the current through address transistor 18. At time $T_4$, while the ground voltage is still applied to data bus 14, the $\phi_R$ clock signal 38 goes to ground voltage. Because of capacitive coupling, return of the $\phi_R$ clock signal to ground voltage causes the voltage at node B to become less negative. When the voltage at node B reaches approximately −17 volts (where node A is at −13 volts) read and boost transistor 22 turns off. With transistor 22 turned off, the charge on node A is rapidly bled to data bus 14. As the charge on node A is bled to data bus 14, the voltage at node A will rise toward ground voltage. Once node A becomes more positive than −13 volts, isolation transistor 24 will become conductive and the charge on node B will also be bled to data bus 14. In consequence, both nodes A and B will be discharged to ground voltage. Thereafter, at time $T_5$, the drive voltage on data bus 14 will be turned off and address signal 36 will return to ground voltage whereby address transistor 18 will also turn off. This stores a logical zero in memory cell 10.

If a logical one is to be stored in memory cell 10, then data bus 14 will be driven with a voltage of −13 volts beginning at time $T_3$. If the memory cell 10 was previously storing a logical zero, then nodes A and B which were previously at substantially ground voltage will charge toward −13 volts. If the voltage at node A reaches −13 volts, address transistor 18 will be rendered nonconductive because the voltage applied between the gate electrode and the drain electrode will then be less than $V_{T(18)}$ as the gate to source voltage has been since time $T_3$. When the $\phi_R$ read clock signal 38 goes to ground voltage at time $T_4$, there will be substantially no effect on the charging of nodes A and B because of the small value of capacitance in SMOC 26 which results from the previous storage of a logical zero. When the $\phi_3$ clock signal and the address signal 36 return to ground voltage at time $T_5$ the memory cell will be left with approximately −13 volts at nodes A and B which comprises the storage of a logical one.

If the memory cell previously stored a logical one, then node A and data bus 14 are already charged to a voltage in the vicinity of −13 volts at the time $T_3$ when the logical one (−13 volts) is impressed on data bus 14. When the $\phi_R$ clock signal goes to ground voltage at time $T_4$, there will be substantially no effect on the charging of node A or the conduction of address transistor 18. In consequence, when address signal 36 and $\phi_3$ clock signal 34 return to ground voltage at time $T_5$ nodes A and B will be left charged to approximately −13 volts which corresponds to the storage of a logical one.

We have discovered that a problem with the above-described prior art memory cell can exist in an otherwise acceptable memory cell when a logical one is written into a memory cell during the write period of one clock cycle and is read during the read period of the next succeeding clock cycle. As will be apparent from the above description, this next succeeding read period occurs prior to the time when the cell is first refreshed. In some chips, this read-immediately-after write where a logical one was written results in the loss of the stored one in some of the memory cells. This causes a rejection of those circuits in final testing. The problem appears to result from production variations from cell to cell within production tolerances.

This problem may be a result of nodes A and B not having been charged to −13 volts prior to the end of the write period in which the logical one is written into the memory cell. This failure to charge to −13 volts would be a result of the memory cell being slow to charge during a write period. As a consequence, the voltage at nodes A and B will be less negative than −13 volts at the beginning of the next succeeding read period which causes the voltage at node B during the read period to be less negative than −25 volts which in turn results in read and boost transistor 22 having a $V_{gs}$ of less than 8 volts. The reduced $V_{gs}$ of transistor 22 increases the impedance over what it is when $V_{gs}$ equals 8 volts. This increased impedance in read and boost transistor 22 causes transistor 22 to be unable to carry the quantity current which flows through address transistor 18 without the voltage at node A becoming less negative than −13 volts. As a consequence, isolation transistor 24 becomes conductive. Conduction in transistor 24 rapidly dissipates the charge at node B, thus causing the voltage at node B to approach the voltage at node A and read transistor 22 to turn off. This destroys the logical one which was stored in memory cell 10.

Experiments have shown that the first refresh or boost cycle following the writing of a logical one supplies about two-thirds of the difference between the ultimate charge stored on node B of memory cell 10 and the initial charge stored on node B. Consequently, in order to overcome the problem of the loss of a logical one which is read in the clock cycle immediately following the clock period in which it was written, we have developed a read clock signal which refreshes the information stored in memory cell during the period of time between the write period of each clock cycle and the read period of the next succeeding clock cycle. When this clock signal is applied to the above-described memory cell, it results in refreshing the information stored in the memory cell twice during each clock cycle in which the memory cell is not addressed. That is, the information is refreshed during the read period of the clock cycle and again prior to the end of the clock cycle. Where a weak logical one is written into a cell, the provision of a refresh cycle between the write period in which the weak logical one is written into the memory cell and the read period in which the logical one is read from memory cell provides a substantial increase in the quantity of charge on storage node B prior to the first read period following the writing of the logical one into the memory cell. This boost in charge is sufficient in a significant percentage of devices to make an otherwise unacceptable cell acceptable. Use of this technique has been found to provide a significant increase in the yield of acceptable memory chips.

Figure 3:
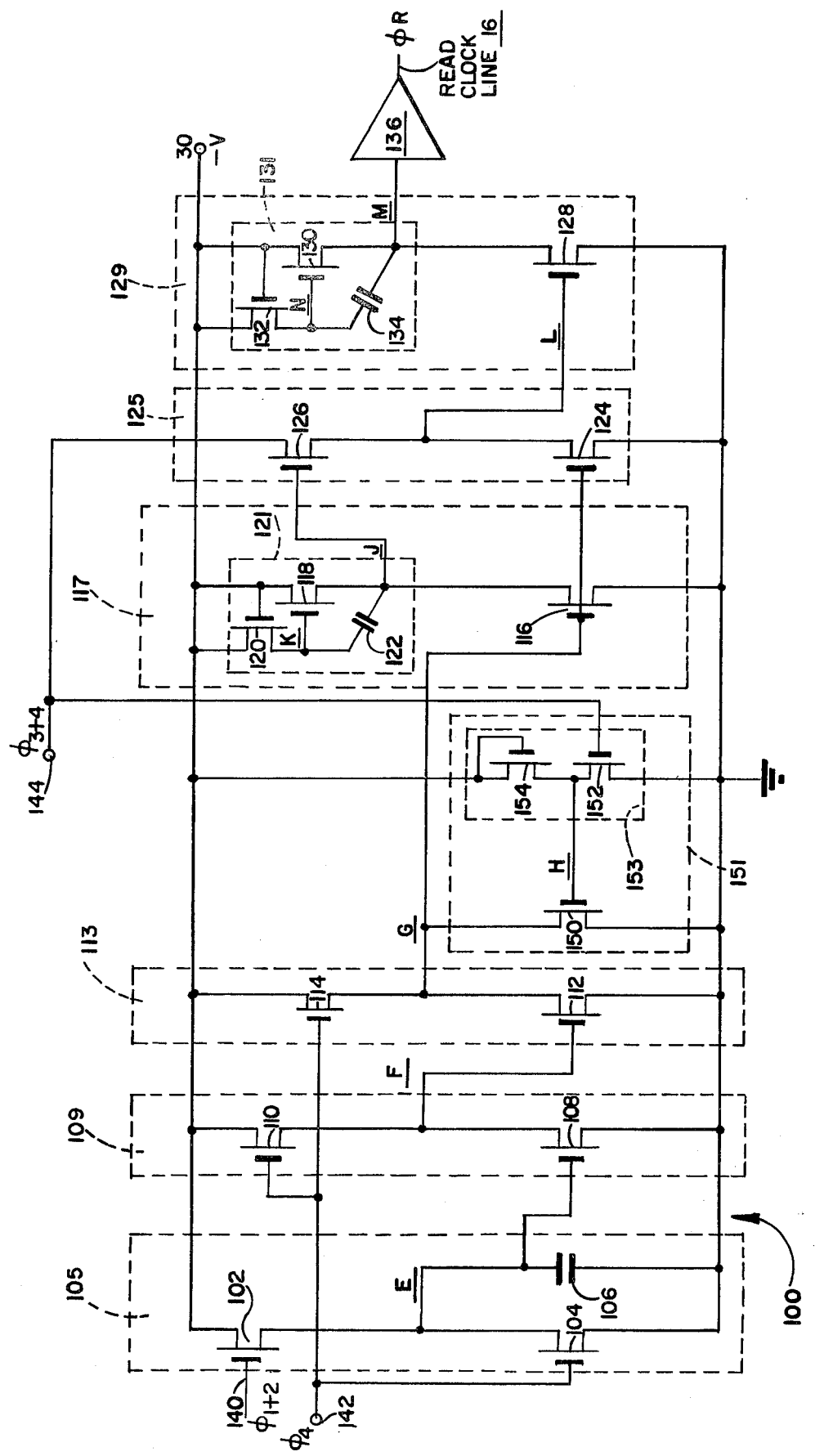
FIG. 3 is one circuit embodiment for implementing the method of the instant invention.

A read clock generator 100 which will generate a read clock signal in accordance with this invention is illustrated in FIG. 3. It will be understood that the circuit of FIG. 3 is a preferred embodiment and is not the only circuit which can provide multiple refresh pulses per clock cycle in accordance with this invention.

Throughout the preferred embodiment of the read clock generating circuit 100, the transistors are P channel enchancement mode field effect transistors, although the circuit can also be constructed to utilize other varieties of transistors. Read clock generator 100 comprises a delay circuit 105 two two-input ratio circuits 109 and 113, a clocked clamp circuit 151, two single-input, bootstrapped, ratio circuits 117 and 129, a three input gate 125 and a power amplifier 136.

Delay circuit 105 comprises a timing capacitor 106 and two field effect transistors, 102 and 104. Transistor 102 has the drain thereof connected to a relatively negative voltage supply 30, which in the illustrated embodiment provides a voltage of −17 volts. The gate of transistor 102 is connected to a clock line 140 to which a $\phi_{1+2}$ clock signal 72 is applied. The source of transistor 102 is connected to the drain of a transistor 104 at a node E. The source of transistor 104 is connected to a reference voltage source such as ground. The gate electrode of transistor 104 is connected to a clock line 142 on which a $\phi_4$ clock signal is impressed by means not shown. Timing capacitor 106 has one plate thereof connected to node E and the other plate thereof connected to ground. Node E comprises the output terminal of timing circuit 105.

Within delay circuit 105, transistor 102 controls charging of timing capacitor 106 and transistor 104 controls discharge of capacitor 106. Transistor 102 is constructed to have a low on-resistance so that capacitor 106 will charge up rapidly. Transistor 104 is constructed to have a relatively high on-resistance to give capacitor 106 a relatively long discharge time constant. Consequently, capacitor 106 discharges to within one threshold voltage of transistor 108 $V_{T(108)}$ of ground voltage in about 200 ns.

Depending on circuit parameters, it may also be necessary to adjust the threshold voltage of transistor 108 in order to assure that transistor 108 is rendered non-conductive within the 200 ns period allowed for discharge of capacitor 106.

Two input ratio circuit 109 comprises a series connection of two field effect transistors, 108 and 110. The gate electrode of transistor 108 comprises a first input terminal of ratio circuit 109 and is connected to the output terminal of delay circuit 105. The source of transistor 108 is connected to ground and the drain of transistor 108 is connected to a node F which constitutes the output terminal of ratio circuit 109. Transistor 110 has the drain thereof connected to negative voltage source 30 and the source thereof connected to output node F. Transistor 108 is constructed to have an on-resistance which is much lower than the onresistance of transistor 110. Consequently when both transistor 108 and transistor 110 are on, i.e. conductive, the voltage at output node F will be near ground level. This construction of transistors 108 and 110 is sometimes referred to as ratioing the transistors, since it is the ratio of the on-resistances of the two transistors which determines the voltages at node F when both are conductive.

Two input ratio circuit 113 comprises two field effect transistors 112 and 114. The gate electrode of transistor 112 is a first input terminal of ratio circuit 113 and is connected to the output terminal of ratio circuit 109 at node F. The source of transistor 112 is connected to ground and the drain of transistor 112 is connected to a node G which comprises the output terminal of ratio circuit 113. The gate electrode of transistor 114 comprises the second input terminal of ratio circuit 113 and is connected to the $\phi_4$ clock line 142. The drain of transistor 114 is connected to negative voltage supply 30, the source of transistor 114 is connected to output node G. Transistors 112 and 114 are ratioed so that when both transistor 114 are on or conductive, the voltage at node G will be near ground level.

Clocked clamp circuit 151 comprises of a single-input ratio-circuit 153 and a field effect transistor 150. Ratio circuit 153 is comprised of field effect transistors 152 and 154. The gate electrode of transistor 152 comprises the input terminal of ratio circuit 153 and is connected to a $\phi_{3+4}$ clock line 144. The source of transistor 152 is connected to ground and the drain of transistor 152 is connected to a node H which comprises the output terminal of ratio circuit 153. Transistor 154 has the source thereof connected to node H and the drain and gate thereof connected to negative voltage source 30. Transistors 152 and 154 are ratioed so that when both transistors 152 and 154 are conductive, the voltage at node H will be near ground level. Transistor 150 has the drain thereof connected to the output terminal of ratio circuit 153 at node G. The source of transistor 150 is connected to ground and the gate of transistor 150 is connected to a node H whereby transistor 150 is rendered conductive when the voltage at node H is more than one threshold voltage more negative than ground. Clocked clamp circuit 151 thereby clamps node G at ground voltage when the $\phi_{3+4}$ clock signal is at ground voltage.

Single-input, bootstrapped, ratio circuit 117 comprising a field effect transistor 116 and a bootstrap circuit 121 has the single input terminal thereof connected to node G. The output terminal is connected to a node J. The gate electrode of transistor 116 comprises the input terminal of bootstrapped ratio circuit 117 and is connected to node G. Transistor 116 has the source thereof connected to ground and the drain thereof connected to the output terminal of the bootstrapped ratio circuit 117 at node J. Bootstrap circuit 121 is comprised of two field effect transistors 118 and 120 and a positive feedback capacitor 122. Transistor 118 has the source thereof connected to node J, the drain thereof connected to negative voltage supply 30 and the gate electrode thereof connected to a node K internal to bootstrap circuit 121. Transistor 120 has the drain and gate thereof connected to negative voltage supply 30 and the source thereof connected to the internal node K. Capacitor 122 has one plate thereof connected to node K and the other plate thereof connected to node J. To assure proper operation of bootstrap circuit 121, capacitor 122 should have an effective capacitance which is at least about 3 times the value of the competing stray capacitance associated with node K. Circuit 121 is called a bootstrap circuit because when the voltage at node J has been high (near ground level) and becomes negative (because transistor 116 has become non-conductive), the voltage at node K is bootstrapped or driven more than one threshold voltage more negative than voltage source 30. This causes the voltage at node J to drop to the negative source voltage, rather than to $V_T$ volts above the negative source voltage as would be the case in the absence of bootstrapping. Transistors 116 and 118 are ratioed so that when both are on, the voltage at node J will be near ground level.

Three input terminal gate circuit 125 comprises two field effect transistors 124 and 126. The gate electrode of transistor 124 constitutes a first input terminal of gate circuit 125 and is connected to node G. The source of transistor 124 is connected to ground and transistor 124 has the drain thereof connected to node L which is the output terminal of gate circuit 125. The gate electrode of tansistor 126 comprises the second input terminal of gate circuit 125 and is connected to node J. The drain electrode of transistor 126 comprises the third input terminal of gate circuit 125 and is connected to clock line 144. The source of transistor 126 is connected to output node L.

Single-input, bootstrapped, ratio circuit 129 is similar to bootstrapped ratio circuit 117 and comprises a field effect transistor 128 and a bootstrap circuit 131 and has the input terminal thereof connected to node L and has the output terminal thereof connected to a node M. The gate electrode of transistor 128 is the input terminal of bootstrapped ratio circuit 129 and is connected to node L. The source of transistor 128 is connected to ground and the drain of transistor 128 is connected to node M which is the output terminal of bootstrapped ratio circuit 129. Bootstrap circuit 131 comprises two field effect transistors 130 and 132 and a positive feedback capacitor 134. Transistor 130 has the source thereof connected to output node M, the drain thereof connected to negative voltage supply 30 and the gate thereof connected to a node N internal to bootstrap circuit 131. Transistor 132 has the gate and drain thereof connected to negative voltage supply 30 and the source thereof connected to the internal node N. Capacitor 134 has one plate thereof connected to node N and the other plate thereof connected to node M. Transistors 128 and 130 are ratioed so that when both are on the voltage at node M will be near ground level.

Power amplifier 136 has the input terminal thereof connected to node M and the output terminal thereof connected to drive the read clock line 16 of memory cell 10.

OPERATION OF THE PREFERRED EMBODIMENT

Figure 4:
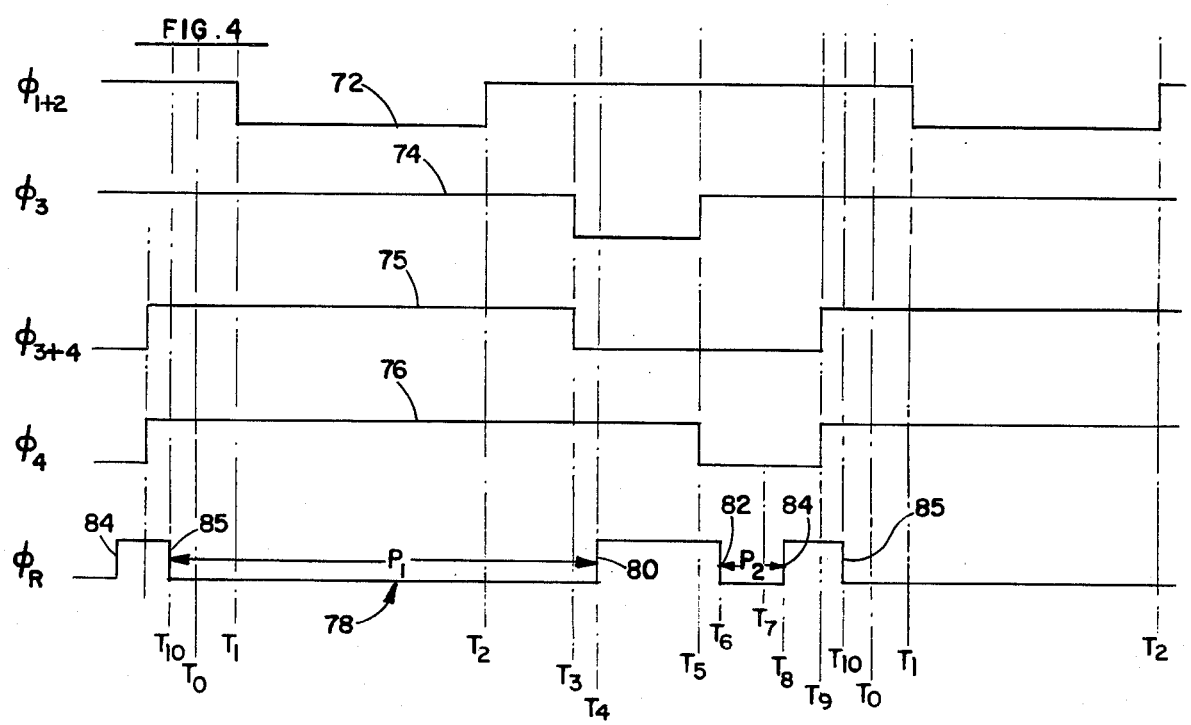
FIG. 4 is a diagram of clock signals utilized in or produced by the circuit of FIG. 3.

With reference to FIGS. 3 and 4, the preferred embodiment of the read clock signal generator 100 operates in the following fashion. The read clock signal generator 100 is supplied with three input clock signals: $\phi_{1+2}$, $\phi_{3+4}$ and $\phi_4$. For purposes of this description, a time $T_o$ has been arbitrarily chosen as the beginning of a clock cycle. At time $T_o$, as illustrated in FIG. 4, the $\phi_{1+2}$ clock signal which is applied to clock line 140, the $\phi_{3+4}$ clock signal which is applied to clock line 144 and the $\phi_4$ clock signal which is applied to clock line 142 are all at ground voltage. At time $T_o$, the read clock signal $\phi_R$ produced by generator 100 is at its most negative value. With ground voltage applied to clock lines 140 and 142 transistors 102 and 104 are both off or non-conductive. Therefore, the voltage at node E floats at its last attained voltage. As will be seen hereinafter, at this time the voltage at node E floats within one threshold voltate ($V_T$) of ground voltage so that transistor 108 is off or non-conductive.

Transistor 110 is off because the gate electrode thereof is held at ground voltage by the $\phi_4$ clock signal on clock line 142. The voltage at node F floats at its last attained voltage because both transistors 108 and 110 are non-conductive. As will be seen hereafter, that last attained voltage is one threshold voltage ($V_T$) above the voltage of negative source 30.

Transistor 112 is rendered conductive by the substantial negative voltage at node F. Transistor 114 is held non-conductive by the ground voltage applied to the gate thereof by the $\phi_4$ clock signal on clock line 142. Since transistor 112 is conductive and transistor 114 is nonconductive, the voltage at node G is pulled up to and clamped at ground level by the conduction through transistor 112. Because the voltage applied to the gate electrode of transistor 112 by node F is more negative than $-V_T$ volts, there is no loss of a voltage threshold across transistor 112 and node G is at ground level.

Clocked clamp circuit 151 is active because the $\phi_{3+4}$ clock signal on clock line 144 is at ground level. Application of ground voltage to the gate electrode of transistor 152 renders transistor 152 nonconductive. Transistor 154 is always conductive so long as node H is more than one threshold voltage more positive than negative voltage source 30. Conduction through transistor 154 pulls the voltage at node H down to $V_T$ volts above the −17 volts supplied by negative voltage source 30. With node H at this voltage level, transistor 150 is held conductive by the negative voltage at node H. Consequently, conduction through transistor 150 pulls the voltage at node G up to ground level. Therefore, conduction through transistor 150 of clocked clamp circuit 151 aids conduction through transistor 112 in holding node G at ground voltage.

With node G held at ground voltage, both transistors 116 and 124 are nonconductive. As will be seen hereinafter, under these conditions the internal node K of bootstrap circuit 121 is capacitively boosted to a voltage more than one threshold voltage more negative than negative source 30. Transistor 120 is nonconductive because the drain and gate electrodes thereof are at the negative voltage provided by source 30 and the source of transistor 120 is held at the even more negative volpresent at node K. Transistor 118 is conductive because the gate thereof is at a voltage which is more than one threshold voltage more negative than negative voltage source 30. Conduction through transistor 118 clamps node J at a negative voltage equal to the −17 volts supplied by negative voltage source 30.

Transistor 126 is conductive because the gate thereof is provided with −17 volts by node J and the source thereof is connected to clock line 144 which is at ground voltage. The voltage at node L is held at ground level, because conduction through transistor 126 clamps node L at ground voltage supplied by the $\phi_{3+4}$ clock on clock line 144.

The ground voltage at node L holds transistor 128 off. Under these conditions, as will be seen hereinafter, the internal node N of bootstrap circuit 131 is capacitively boosted to a voltage which is more than one threshold voltage more negative source 30, in the same manner as in bootstrap circuit 121. Conduction through transistor 130 clamps node M is at a negative voltage equal to the voltage level supplied by source 30. With node M at the negative source voltage, the output of amplifier 136 is also at the negative source voltage and the read clock $\phi_R$ is at the −17 volts provided by negative source 30. The read clock signal is in its first read or refresh pulse $P_1$ of the clock cycle at this time.

The first input clock signal to change from the ground voltage conditions existing at time $T_o$ is the $\phi_{1+2}$ clock signal which is applied to clock line 140. At time $T_1$ the $\phi_{1+2}$ clock voltage goes to −17 volts. This renders transistor 102 conductive because the source thereof is connected to node E, the voltage at which is more than one threshold voltage more positive than the −17 volts applied to the gate of transistor 102 by clock line 140. Transistor 104 remains nonconductive because ground voltage is still applied to the gate thereof by the $\phi_4$ clock signal on clock line 142. With transistor 104 nonconductive, any current through transistor 102 must come from capacitor 106. Consequently, capacitor 106 charges to a negative voltage of −13 volts (the −17 volts provided by negative source 30, plus the 4 volts threshold voltage of transistor 102 under these conditions). Transistor 108 becomes conductive when node E becomes more negative than −2 volts (the threshold voltage of transistor 108 is − 2 volts since the source is at ground potential). Because the clock signal on clock line 142 is still at ground voltage, transistor 110 remains nonconductive and node F is pulled up to ground level by conduction in transistor 108. No threshold voltage drop is lost across transistor 108 because the gate thereof is more negative than the source thereof by more than one threshold voltage. With node F at ground voltage, transistor 112 turns off. The turn off of transistor 112 produces no other change in the conditions in clock generator 100 because transistor 150 of clocked clamp circuit 151 is still conductive. Even if clocked clamp circuit 151 were omitted from read clock signal generator 100, no voltage changes would result from transistor 112 turning off. However, the voltage at node G would then float at ground level, rather than being clamped at ground level. The function of circuit 151 is explained subsequently.

Read clock signal generating circuit 100 retains the above newly acquired voltage levels and conduction states until the $\phi_{1+2}$ clock signal on clock line 140 returns to ground voltage at time $T_2$. When the $\phi_{1+2}$ clock signal returns to ground voltage, transistor 102 is rendered nonconductive because the gate there is then substantially more positive than either the source or drain thereof. The cessation of conduction in transistor 102 produces no change in the voltage on node E because the other transistor (104) connected to node E is also nonconductive. Consequently, node E floats at −13 volts.

The next change in circuit conditions occurs when the $\phi_{3+4}$ clock signal on clock line 144 becomes negative at time $T_3$. The $\phi_{3+4}$ clock signal is applied to the gate of transistor 152 and to the drain of transistor 126. The gate of transistor 152 is driven to −17 volts when the $\phi_{3+4}$ clock signal on clock line 144 drops to −17 volts and transistor 152 is rendered conductive thereby. As explained above, transistor 152 and 154 are ratioed so that with both transistors on, the voltage at node H will be negative by less than the voltage threshold of transistor 150 This renders transistor 150 nonconductive. Whereupon each transistor (112, 114, and 150) capable of conducting current into or cut of node G is nonconductive. Under these conditions, node G floats at its last obtained voltage—substantially ground level. Consequently, the release of clock clamp circuit 151 by the application of the negative voltage to clock line 144 produces other voltage effects within the body of the read clock generator 100.

As noted above, transistor 126 is conductive before the $\phi_{3+4}$ clock voltage becomes negative because the gate of transistor 126 is held at −17 volts by transistor 118. Consequently when −17 volts is applied to the drain thereof, transistor 126 conducts current from node L until the voltage at node L becomes more negative than −13 volts — i.e. until there is less voltage applied between the source and gate of transistor 126 than the threshold voltage of transistor 126.

Transistor 124 is still nonconductive because node G is still at ground potential. Consequently, conduction through transistor 126 pulls the voltage at node L down to one threshold voltage above the negative voltage provided on clock line 144. This is substantially −13 volts for the assumed 4 volt threshold of transistor 126 and the assumed −17 volts on clock line 144. Once node L becomes negative by more than one threshold voltage, transistor 128 is rendered conductive. Thereupon, the voltage at node M will approach ground voltage because transistors 128 and 130 are ratioed such that node M approaches substantially ground level when both transistors are conductive. With the voltage at node M at substantially ground level, the output of the read clock amplifier 136 is driven to ground voltage at time $T_4$. There is a short delay between time $T_3$ when the $\phi_{3+4}$ clock signal becomes negative and time $T_4$ when the read clock signal $\phi_R$ reaches ground level. This time delay is induced by the ripple through time for transistors 126 and 128 which is only a few nanoseconds and by a time delay of about 50 nanoseconds built into amplifier 136. This transition 80 of the read clock voltage 78 from −17 volts to ground voltage at time $T_4$ terminates the first read or refresh pulse $P_1$ of the clock cycle.

When the voltage at node M is pulled up to substantially ground voltage, the voltage at node N of bootstrap circuit 131 is pulled up a substantially equal number of volts because of the coupling effect of capacitor 134. If the voltage at node N becomes more than one threshold voltage more positive than negative source 30, transistor 132 becomes conductive. Conduction through transistor 132 pulls the voltage at node N down toward the negative source voltage. If the voltage at node N is (or drops to) within one threshold voltage of the negative source voltage, transistor 132 will remain (or become) nonconductive. Conduction through transistor 132 is the only mechanism available for pulling the voltage at node N more negative, consequently, the voltage at node N will stay at a voltage which is substantially equal to the negative source voltage of −17 volts plus one transistor threshold voltage of 4 volts, or substantially −13 volts.

For read clock signal generator 100 to work, the voltage at node M must rise to within one threshold voltage of ground voltage. Consequently, −2 volts is the most negative voltage which could be present at node M when transistor 128 is conductive. Consequently, the voltage across capacitor 134 (from node M to node N which is the source to gate voltage of transistor 130) must be at least −11 volts (when there is −2 volts at node M) and could be as great as −13 volts (if node M where at ground voltage).

No further changes in the conduction or voltage conditions within read clock generator circuit 100 take place until time $T_5$ when the $\phi_4$ clock signal applied to clock line 142 becomes negative (−17 volts). Application of the −17 volts on clock line 142 to the gate electrode of transistor 104 renders transistor 104 conductive and timing capacitor 106 begins a controlled discharge through transistor 104. This discharge is, however, relatively slow because transistor 104 has been intentionally constructed to have a relatively high on-resistance. It is preferred that capacitor 106 discharge to one transistor threshold voltage in about one-half of the period of time that the $\phi_4$ clock signal is negative. Therefore, although capacitor 106 begins discharging when the $\phi_4$ clock signal becomes negative at time $T_5$, the discharging of capacitor 106 does not produce any changes in the voltages at or conduction through any other circuit elements at time $T_5$.

Transistor 110 is rendered conductive by the application of the −17 volts $\phi_4$ clock signal to the gate thereof at time $T_5$. However, node F remains within one threshold of ground and transistor 112 remains nonconductive because transistors 108 and 110 are ratioed so that node F will be less than one transistor threshold voltage negative when both transistors 108 and 110 are conductive, as both now are.

The application of the negative 17 volts of clock signal $\phi_4$ to the gate of transistor 114 renders transistor 114 conductive at time $T_5$. With transistor 114 conductive, and transistors 112 and 150 nonconductive, the voltage at node G is pulled to −13 volts (one transistor threshold voltage more positive than negative source 30). When node G becomes more than one transistor threshold voltage negative, transistors 116 and 124 are rendered conductive. Consequently, two events occur simultaneously.

First, because transistors 116 and 118 are ratioed, conduction in transistor 116 pulls the voltage at node J up to within one threshold voltage of ground voltage despite the conduction in transistor 118. When the voltage at node J rises to within one threshold voltage of ground voltage, transistor 126 becomes nonconductive because there is no longer a voltage of more than one transistor threshold-voltage applied between the gate electrode and source thereof. When the voltage at node J is pulled up to within one threshold voltage of ground level, node K is pulled up above the negative source voltage by the coupling effect of capacitor 122. The effects of this within bootstrap circuit 121 are the same as the effects in bootstrap circuit 131 described previously. Consequently, transistor 118 remains conductive.

Second, because transistor 126 is now nonconductive and transistor 124 is conductive, the voltage at node L is pulled up to ground voltage. Once the voltage at node L is pulled up to ground level, transistor 128 turns off and becomes nonconductive. Conduction through transistor 124 clamps the voltage at node L at ground voltage.

With transistor 128 off, bootstrap circuit 134 operates in the following fashion. Prior to the turn off of transistor 128, the voltage at node M has been within one transistor threshold-voltage of ground voltage. Consequently, as explained above, transistor 130 is conductive and there is more than 11 volts across capacitor 134. Transistor 132 is also conductive if and only if the voltage at node N is more than one transistor-threshold-voltage more positive than the voltage provided by negative voltage source 30. When transistor 128 turns off, conduction through transistor 130 renders the voltage at node M more negative. As the voltage at node M becomes more negative, the voltage at node N also becomes more negative by a substantially equal amount because of the capacitive coupling between two nodes due to capacitor 134. Consequently, a substantially constant voltage tends to remain applied from the source to gate of transistor 130. This retains transistor 130 conductive.

If transistor 132 was not already nonconductive, it is rendered nonconductive as soon as the voltage at node N decreases so that the voltage at node N is no longer more than one transistor-threshold-voltage more positive than the voltage provided by negative voltage source 30. Once transistor 132 is (or becomes) nonconductive, the voltage across capacitor 134 is controlled by the ratio of the capacitance of capacitor 134 and the sum of all the stray capacitances from node N to all nodes other than node M. The capacitance value of capacitor 134 is usually chosen to be about 3 times the sum of the stray capacitances at node N to ensure a substantially constant voltage drop across capacitor 134. Since capacitor 134 is connected from the source electrode to the gate electrode of transistor 130, the source-to-gate voltage of transistor 130 is also controlled. The voltage across capacitor 134 is always substantially more than one transistor-threshold-voltage. Consequently, transistor 130 remains conductive and conduction therethrough pulls the voltage at node M down to the negative source voltage and the voltage at node N drops well below the negative source voltage because of the capacitive coupling from node M to node N.

It is the bootstrap connection of transistors 130 and 132 and capacitor 134 which makes it possible to pull the voltage at node M down to the negative source voltage of −17 volts. With the −17 volts at node M as the input of amplifier 136, the amplifier produces −17 volts at the output thereof at time $T_6$. Consequently, read clock signal 78 becomes −17 volts at a time $T_6$. Time $T_6$ is delayed from time $T_5$ by the ripple through time from transistor 114 to node M plus the delay time of amplifier 136. This transition 82 of the read clock voltage 78 from ground voltage to −17 volts at time $T_6$ starts the second refresh pulse $P_2$ of the clock cycle. Refresh pulse $P_2$ is never a read pulse because address line 12 is always a ground voltage during the $P_2$ pulse. The $P_2$ pulse is always the first refresh pulse after a write operation and always preceeds the next read operation.

Once these conditions have been obtained, no further change in the conditions within read clock generator 100 take place until transistor 104 discharges capacitor 106 to within about one transistor-threshold-voltage of ground level during the time the $\phi_4$ clock is negative. At time $T_7$ when the voltage at node E rises close enough to ground voltage, transistor 108 can no longer hold node F within one transistor-threshold-voltage of ground voltage. While transistor 108 is turning off, the conduction through transistor 110 pulls the voltage at node F down to one transistor threshold voltage above the negative voltage supply. This renders transistor 112 conductive. With both transistors 112 and 114 conductive, the voltage at node G is pulled up to within one transistor-threshold-voltage of ground level as a result of the ratioing of transistors 112 and 114.

While the voltage at node G is rising to within one transistor-threshold-voltage of ground voltage, transistors 116 and 124 are turning off. The turning off of transistor 124 alone would not affect the voltage at node L because transistor 126 would be held off by the high voltage at node J and node L would therefore float at its last obtained voltage. However, while transistor 116 is shutting off, the voltage at node J is being pulled down by conduction in transistor 118 and bootstrap circuit 121 takes over control of the voltage at node J. Transistor 120 is already nonconductive or barely conductive because it has already pulled the voltage at node K down to one transistor-threshold-voltage above the negative supply 30. Consequently, transistor 120 is rapidly rendered nonconductive by any negative movement of the voltage at node J and thus node K. With −11 volts across capacitor 122, node K is held at a voltage substantially greater than one threshold voltage more negative than the voltage at node J. Under these conditions, transistor 118 remains conductive. Therefore, the voltage at node J is pulled down toward the −17 volts applied by negative supply 30. As the voltage at node J is pulled negative, the voltage at node K becomes more negative, thus assuring that transistor 120 will become (or remain) nonconductive. With transistor 120 off, a substantially constant voltage is applied from the source to the gate of transistor 118. This holds transistor 118 conductive. Consequently, the voltage at node J pulled down to −17 volts. When node J becomes negative by more than one threshold voltage, transistor 126 is turned on and the voltage at node L is pulled more negative since −17 volts is still applied to the drain of transistor 126 by the $\phi_{3+4}$ clock signal on clock line 144. When node J reaches −17 volts, node L will reach −13 volts. Once node L becomes negative by more than one transistor-threshold-voltage, transistor 128 becomes conductive. As explained previously, since transistors 128 and 130 are ratioed, node M is pulled up close to ground level whenever transistor 128 is conductive. Once node M is pulled up close to ground level, amplifier 136 produces an output voltage substantially at ground level one amplifier delay time (50 nanoseconds) thereafter at time $T_8$. Consequently, the read clock signal $\phi_R$ returns to ground level at time $T_8$. This transition 84 of the read clock voltage 78 from −17 volts to ground voltage at time $T_8$ terminates the second read or refresh pulse $P_2$ of the clock cycle.

During the time that node M has been at −17 volts, transistor 132 has been nonconductive. Consequently, the voltage across capacitor 134 has not changed substantially and transistor 130 has remained conductive the entire time. As a result, there is very little charge flow into capacitor 134 when node M returns to ground level. However, any leakage to node N such that node N is now more positive than −13 volts is compensated by conduction through transistor 132 and capacitor 134. Conduction will continue through capacitor 134 and transistor 132 until node N comes within one threshold voltage of the negative supply.

When the $\phi_{3+4}$ and $\phi_4$ clock signals return to ground level at time $T_9$, transistors 104, 110, 114, and 152 turn off and become nonconductive. The negative supply voltage which is clamped to node J by bootstrap circuit 121 holds transistor 126 conductive. Since ground voltage is now applied to clock line 144, the voltage at node L is pulled up to ground level. This shuts transistor 128 off. With transistor 128 turned off, bootstrap circuit 131 once again pulls node M down to −17 volts. One amplifier delay time thereafter the read clock signal $\phi_R$ returns to −17 volts at time $T_{10}$. This transition 85 starts the first read or refresh pulse $P_1$ of the next clock cycle.

It will be noted that between time $T_{10}$ of one clock cycle and time $T_0$ of the succeeding clock cycle, transistors 112, 118, 126, 130, 150, and 154 are conductive, transistors 102, 104, 108, 110, 114, 116, 120, 124, 128, 132 and 152 are nonconductive, the voltage at node E is floating within one threshold voltage of ground level, the voltage at node F is floating one threshold voltage above the negative voltage source, the voltages at nodes G and L are clamped at ground voltage, the voltage at node H is clamped at one threshold voltage above the negative voltage source, the voltages at nodes J and M are clamped at the negative supply voltage and the voltages at nodes K and N are capacitively bootstrapped to more than one transistor-threshold-voltage more negative than the negative voltage supply. These conditions are consistent with the conditions which were previously specified as existing at time $T_0$. A full clock cycle has now passed and the conditions which existed at time $T_0$ reoccur. The clock signal generating system is now ready to begin the next clock cycle.

If clocked clamped circuit 151 were omitted and if the time constant of delay circuit 105 were so long that capacitor 106 had not discharged to within about one transistor-threshold-voltage of ground level prior to time $T_9$ when the $\phi_4$ and $\phi_{3+4}$ clock signals return to ground voltage, then node J would still be at ground voltage and transistor 126 would still be nonconductive when the $\phi_{3+4}$ and $\phi_4$ clocks return to ground voltage at time $T_9$. With transistor 126 nonconductive, node L would be held at ground voltage by conduction in transistor 124 and transistor 128 would still be nonconductive and the transitions in the read clock voltage 78 at times $T_8$ and $T_{10}$ would not have occurred. Consequently there would be only one read or refresh pulse $P_1$ in the clock cycle. However the −17 volt to ground voltage transition 80 of the $\phi_R$ clock signal would not occur in the following clock cycle, since transistor 126 must be conductive at time $T_3$ for transition 80 to occur. Consequently the $\phi_R$ clock signal would cease and the memory would be inoperative. Clocked clamp circuit 151 is included in the read clock signal generating circuit 100 to assure that poor yield of the time delay circuit 105 of generator 100 does not cut into the yield of memory circuits which would have met specifications with the prior art read clock signal. Through use of the clocked clamped circuit 151, poor yield in the time delay circuit 105 of read clock generator 100 produces a clock signal identical to the prior art clock signal in the following manner. Assuming that node E is still more negative than one threshold voltage at the time that the $\phi_{3+4}$ clock signal on clock line 144 shuts off, the voltage at node G would float negative without the clocked clamp circuit 151. However, with the clocked clamped circuit 151 included, the return of the clock signal on line 144 to ground voltage turns transistor 152 off. With transistor 152 off, transistor 154 pulls the voltage at node H down to one threshold voltage above the −17 volts provided by source 30, thus rendering transistor 150 conductive. Conduction in transistor 150 pulls the voltage at node G up to ground level. With the voltage at node G pulled up to ground level, transistors 116 and 124 turn off. As a result, the voltage at node J drops to the negative supply voltage turning transistor 126 on thereby assuring that the transistion 80 will occur in the designed manner in the following clock cycle.

Thus, there has been shown and described a preferred embodiment of the instant invention. This embodiment is not intended to be limitive but is illustrative only. Those skilled in the art may be able to modify the embodiment described. For example, N channel devices may be employed instead of the described P channel devices and a positive voltage source may be employed rather than the negative voltage source described. Moreover, modified timing relationships may be implemented, so long as a memory refresh pulse occurs between the write period of one clock cycle and the next succeeding read period. Nevertheless, any modifications falling within the purview of the description are intended to be included within the scope of this invention which is limited only by the claims appended hereto.

What is claimed is:

1. Refresh clock signal generating means for generating a refresh clock signal from first and second clock signals, said refresh clock signal including a plurality of pulses per clock cycle, said generating means comprising:
   clocked time delay means having an input terminal and an output terminal, said input terminal connected to a source of said first clock signal for initiating a delay period when said first clock signal obtains a predetermined state;
   first ratio means having first and second input terminals and an output terminal, said first input terminal connected to the output terminal of said clocked time delay means, said second input terminal connected to the source of said first clock signal;
   second ratio means having first and second input terminals and an output terminal, said first input terminal thereof connected to the output terminal of said first ratio means, and said second input terminal thereof connected to the source of said first clock signal;
   first inverter means having an input and an output terminal, said input terminal thereof connected to the output terminal of said second ratio means;
   gate means having first, second and third input terminals, said first input thereof connected to the output terminal of said second ratio means, said second input terminal thereof connected to the output terminal of said first inverter means and said third input terminal thereof connected to a source of said second clock signal; and
   second inverter means having an input and an output terminal, said input terminal thereof connected to the output terminal of said gate means, and the signal at the output terminal thereof comprising the output signal of the refresh clock signal generator.

2. The refresh clock signal generating means recited in claim 1 wherein said clocked time delay means comprises:
   charge storage means;
   precharging means for precharging the charge storage means during a first portion of a clock cycle; and,
   clocked discharge means having an input terminal and an output terminal, said input terminal comprising the input terminal of said clocked delay means, and said output terminal being connected to said clocked precharging means and to said charge storage means and comprising the output terminal of said clocked time delay means.

3. The refresh clock signal generating means recited in claim 2 wherein said precharging means is clocked and has a control terminal connected to a source of a third clock signal.

4. The refresh clock signal generator recited in claim 1 further comprising an output amplifier having an input terminal and an output terminal, said input terminal thereof connected to the output terminal of said second inverter means for amplifying the refresh clock signal.

5. The refresh clock signal generator recited in claim 4 wherein said output amplifier introduces a predetermined time delay into the refresh clock signal.

6. The refresh clock signal generator recited in claim 1 further comprising a clocked clamping circuit having an input terminal and an output terminal, said input thereof connected to the source of said second clock signal and the output terminal thereof connected to the output terminal of said second ratio means for clamping the voltage at the output terminal of said second ratio means at a predetermined potential, whenever said second clock signal is in a predetermined state.

7. The refresh clock signal generator recited in claim 6 wherein said clocked clamping circuit comprises:
   first, second and third field effect transistors, each having gate, source and drain electrodes, said first and second field effect transistors connected in series between a source of a first reference potential and a source of a second reference potential;
   the gate electrode of said first field effect transistor connected to a source of said second clock signal;
   the gate electrode of said second field effect transistor connected to the source of said second reference potential;
   said third field effect transistor connected in series between said source of said first reference potential and the output terminal of said second ratio means; and,
   the gate electrode of said third field effect transistor connected to the common connection between said first and second field effect transistors, whereby said third transistor is conductive when said second clock signal is in a predetermined state, thereby clamping the output terminal of said second ratio means at substantially said first reference potential.

8. The refresh clock signal generator recited in claim 1 wherein each inverter means comprises a series connection of an input field effect transistor and field effect transistor bootstrap circuit, each field effect transistor having gate, source and drain electrodes, the gate electrode of said input field effect transistor comprising the input terminal of said inverter means;

the common connection between said input field effect transistor and said bootstrap circuit comprising the output terminal of said inverter means.

9. The refresh clock signal generator recited in claim 8 wherein each of said bootstrap circuits comprises:

a first field effect transistor connected in series between said output terminal of the inverter means and a source of a reference potential;

a second field effect transistor connected in series between said source of said reference potential and the gate electrode of said first field effect transistor, with the gate electrode of said second field effect transistor connected to said source of said reference potential; and a capacitor connected between the gate electrode of said first field effect transistor and said output terminal.

10. In an electronic memory system of a plurality of memory cells each capable of storing either of two different binary values, each memory cell requiring a periodic application of a refresh pulse to the memory cell to, without rewriting the information contained therein, enhance at least one of said two different binary values in order to prevent the loss of said at least one binary value over a period of time and in which each memory access cycle has a first predetermined portion which is dedicated as a read period and a second predetermined portion which is dedicated as a write period, the method of operating the memory comprising the step of applying to said memory cells during each said memory cycle a refresh signal which includes a plurality of refresh pulses within said memory cycle.

11. The method recited in claim 10 wherein said refresh signal refreshes the information stored in said memory cell a plurality of times during said write period.

12. In an electronic memory system of a plurality of memory cells each capable of storing either of two different binary values, each memory cell requiring a periodic application of a refresh pulse to the memory cell to, without rewriting the information contained therein, enhance at least one of said two different binary values in order to prevent the loss of said at least one binary value over a period of time and in which each memory access cycle during which information is to be written into said memory includes a write period, the method of operating the memory comprising the step of applying to said memory cells during each said memory cycle a refresh signal which includes a plurality of refresh pulses each of which, during said write period refreshes the information stored in said memory cells.

13. An electronic memory system comprising:

a plurality of memory cells each capable of storing either of two different binary values, each of said memory cells requiring the periodic application of a refresh pulse to the memory cell to, without rewriting the information contained therein, enhance at least one of said two different binary values in order to prevent the loss of said at least one binary value over a period of time; and means for applying to said memory cells during each memory cycle a refresh signal including a plurality of refresh pulses within said memory cycle.

14. The memory system recited in claim 13 wherein said memory cycle includes a read period followed by a write period and wherein said refresh signal refreshes the information stored in said memory cells a plurality of times during said write period.

* * * * *